(12) United States Patent
Du et al.

(10) Patent No.: US 8,536,447 B2
(45) Date of Patent: Sep. 17, 2013

(54) ELECTRODE OF SOLAR CELL AND FABRICATING METHOD THEREOF

(75) Inventors: Chen-Hsun Du, Taipei (TW);
Shih-Peng Hsu, Hsinchu County (TW);
Han-Chang Liu, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 520 days.

(21) Appl. No.: 12/412,324

(22) Filed: Mar. 26, 2009

(65) Prior Publication Data

US 2010/0147374 A1   Jun. 17, 2010

(30) Foreign Application Priority Data

Dec. 17, 2008   (TW) ................................ 97149291 A

(51) Int. Cl.
*H01L 31/00*      (2006.01)
*H01L 21/00*      (2006.01)

(52) U.S. Cl.
USPC ............................... 136/256; 438/72; 438/98

(58) Field of Classification Search
USPC ............. 438/72, 98; 136/256; 257/E31.124, 257/E31.127
See application file for complete search history.

(56) References Cited

U.S. PATENT DOCUMENTS

| | | | |
|---|---|---|---|
| 4,471,155 A * | 9/1984 | Mohr et al. | 136/258 |
| 4,595,790 A * | 6/1986 | Basol | 136/256 |
| 4,948,436 A * | 8/1990 | Juergens | 136/249 |
| 5,118,362 A * | 6/1992 | St. Angelo et al. | 136/256 |
| 5,726,065 A | 3/1998 | Szlufcik et al. | |
| 6,100,465 A * | 8/2000 | Shinohara et al. | 136/258 |
| 6,206,996 B1 * | 3/2001 | Hanoka et al. | 156/230 |
| 2004/0242019 A1 | 12/2004 | Klein et al. | |
| 2007/0068570 A1 | 3/2007 | Kim et al. | |
| 2008/0254567 A1 * | 10/2008 | Konno | 438/98 |
| 2009/0133742 A1 * | 5/2009 | Liu et al. | 136/252 |

OTHER PUBLICATIONS

Kaneiwa et al., Prog. Photovolt:Res. Appl. 2002; 10; 77-84.*
Suzuki et al., Thermochimica Acta, 352-353 (2000) 87-90.*
Authored by Blakers, et al., article titled "22.8% efficient silicon solar cell," adopted from Applied Physics Lett.55 (13), Sep. 25, 1989 , pp. 1363-1365.

* cited by examiner

*Primary Examiner* — Eli Mekhlin
(74) *Attorney, Agent, or Firm* — Jianq Chyun IP Office

(57) ABSTRACT

A fabricating method of an electrode of a solar cell includes forming a first electrode layer on a photoelectric conversion layer, forming an antireflective layer on the photoelectric conversion layer to cover the first electrode layer, forming a second electrode layer on the antireflective layer, and performing a sintering process. A material of the first electrode layer does not react with the photoelectric conversion layer and the antireflective layer during the sintering process, while at least a material of the second electrode layer reacts with the antireflective layer during the sintering process. The sintering process is performed, such that the second electrode layer reacts with the antireflective layer, and the second electrode layer penetrates the antireflective layer to electrically connect the first electrode layer.

6 Claims, 8 Drawing Sheets

ELECTRODE OF SOLAR CELL AND FABRICATING METHOD THEREOF

CROSS-REFERENCE TO RELATED APPLICATION

This application claims the priority benefit of Taiwan application serial no. 97149291, filed on Dec. 17, 2008. The entirety of the above-mentioned patent application is hereby incorporated by reference herein and made a part of specification.

BACKGROUND OF THE INVENTION

1. Field of the Invention

The present invention relates to a solar cell, and more particularly to an electrode of a wafer type solar cell and a fabricating method thereof.

2. Description of Related Art

Solar energy is a renewable energy and causes no pollution. To counter problems including pollution and shortage of fossil fuels, the solar energy has always been the most prominent energy. Here, solar cells have become a very important research topic at present because the solar cells can directly convert the solar energy into electrical energy.

The most basic structure of a typical solar cell can be divided into four main parts: a substrate, a P-N junction, an antireflective layer, and two metal electrodes. Generally, the electrodes in the solar cell module are respectively disposed on a non-irradiated surface and an irradiated surface for connecting external circuits. The non-irradiated surface is regarded as a backside, and the irradiated surface is regarded as a front side. The electrode disposed on the irradiated surface (the front side electrode) is designed for improving efficiency of the solar cell. Currently, a method of fabricating the front side electrode frequently adopted in the industry refers to implementation of a screen printing process with use of metal paste containing metal powder, glass frit, and organic carriers and a sintering process for curing the metal paste. However, the existing method of fabricating the front side electrode has following drawbacks.

The silver paste penetrates through an antireflective layer (silicon nitride) to adhere the metal electrodes to a silicon substrate tightly by the glass frit in the silver paste. During said penetration of the glass frit, since the sintering process is frequently performed at an excessively high temperature or for an overly long time, the metal electrodes overreact with the silicon substrate, and the electrodes then penetrate a P-N junction (having a depth approximating to 0.5 micrometers) on a surface of the solar cell, thereby reducing or even deteriorating the efficiency of the solar cell.

A diameter of the glass frit ranges from 10 micrometers to tens of micrometers, thus confining the minimum line width of conductive grid in the electrodes. In most cases, the line width of the conductive grid is greater than 70 micrometers. Hence, the existing method of fabricating the front side electrode cannot be extensively applied as failing to meet current technical requirements for shortening the line width of the conductive grid in the electrodes, increasing an irradiated area, and improving the efficiency.

The electrodes formed by using said metal paste containing the glass frit result in formation of an area with reduced quality in the metal/semiconductor junction, which is apt to cause recombination of carriers and negatively affect the efficiency of the solar cell.

In light of the above drawbacks, methods for forming electrodes other than the metal paste electrodes containing the glass frit are proposed, such as an inkjet printing method, an electroplating method, or the like. For instance, an electrode layer is formed on a substrate having a P-N diode by conducting the inkjet printing method or the electroplating method, and then an antireflective layer is formed on the substrate to cover the electrode layer. Here, in order to electrically connect the electrode layer to external circuits, openings must be formed on the antireflective layer to expose the underlying electrode layer. Alternatively, an antireflective layer is formed on a substrate having a P-N diode, and then openings are formed on the antireflective layer to expose the underlying silicon substrate. Next, electrodes are formed on the exposed silicon substrate by applying the inkjet printing method or the electroplating method.

Nonetheless, in the aforesaid methods of fabricating the electrodes, the openings of the antireflective layer are formed by way of lithography, laser, or the like, and therefore the entire manufacturing process is complicated. Moreover, the formation of the openings on the antireflective layer for exposing the underlying silicon substrate is likely to cause damage to the silicon substrate.

SUMMARY OF THE INVENTION

The present invention is directed to an electrode of a solar cell and a fabricating method thereof for electrically connecting external circuits in no need of forming openings on an antireflective layer. Accordingly, the entire fabrication is rather simple and cost-effective.

The present invention is further directed to an electrode of a solar cell and a fabricating method thereof for not forming openings on an antireflective layer and for preventing an electrode layer from penetrating a P-N junction, thus resulting in simplified fabrication and low manufacturing costs. Moreover, the efficiency of the electrode of the solar cell is not reduced or deteriorated.

In the present invention, a fabricating method of an electrode of a solar cell is provided. The method includes forming a first electrode layer on a photoelectric conversion layer, forming an antireflective layer on the photoelectric conversion layer to cover the first electrode layer, forming a second electrode layer on the antireflective layer, and performing a sintering process. A material of the first electrode layer does not react with the photoelectric conversion layer and the antireflective layer during the sintering process, while at least a material of the second electrode layer reacts with the antireflective layer during the sintering process. The sintering process is performed, such that the second electrode layer reacts with the antireflective layer, and the second electrode layer penetrates the antireflective layer to electrically connect the first electrode layer.

In the present invention, an electrode of a solar cell is provided as well. The electrode of the solar cell includes a first electrode layer, an antireflective layer, and a second electrode layer. The first electrode layer is disposed on a photoelectric conversion layer. The antireflective layer is disposed on the photoelectric conversion layer to cover the first electrode layer. The second electrode layer is disposed on the antireflective layer and electrically connected to the first electrode layer. Here, a material of the first electrode layer does not react with the photoelectric conversion layer and the antireflective layer during a sintering process, while at least a material of the second electrode layer reacts with the antireflective layer during the sintering process.

In the first electrode layer and in a method of forming the same, there is no material reacting with the photoelectric conversion layer and the antireflective layer during the sintering process. Thereby, the first electrode layer can be prevented from penetrating the P-N junction of the photoelectric conversion layer, such that the efficiency of the solar cell formed by the fabricating method of the present invention is neither reduced nor deteriorated.

Besides, the first electrode layer can be formed by applying a method capable of forming the electrode having a small line width, such as an inkjet printing method. Hence, it is likely to form finger-shaped electrodes with the small line width and to increase the irradiated area of the solar cell.

Additionally, in the second electrode layer and in a method of forming the same, there is a material reacting with the antireflective layer during the sintering process, and therefore the second electrode layer can penetrate the antireflective layer and electrically connect the first electrode layer through performing the sintering process in no need of forming openings on the antireflective layer. Thus, it is prone to obtain electricity from the second electrode layer or to implement a welding process for manufacturing modules, giving rise to simplified fabrication and low manufacturing costs.

Moreover, first busbar electrodes are formed in the first electrode layer, and second busbar electrodes and first busbar electrodes in the second electrode layer are overlapped. After implementation of the sintering process, the second busbar electrodes do not go beyond the first busbar electrodes. As such, the second electrode layer is not allowed to penetrate the P-N junction of the photoelectric conversion layer, thereby effectively preventing the efficiency of the electrode of the solar cell from being reduced or deteriorated.

To make the above and other features and advantages of the present invention more comprehensible, several embodiments accompanied with figures are detailed as follows.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

First Embodiment

FIGS. 1 to 4 are schematic flowcharts illustrating a fabricating method of an electrode of a solar cell according to a first embodiment of the present invention. More specifically, sub-diagrams (a) of FIGS. 1 to 4 illustrate schematic top views and sub-diagrams (b) of FIGS. 1 to 4 illustrate schematic cross-sectional views taken along a sectional line I-I'.

Figure 4A:
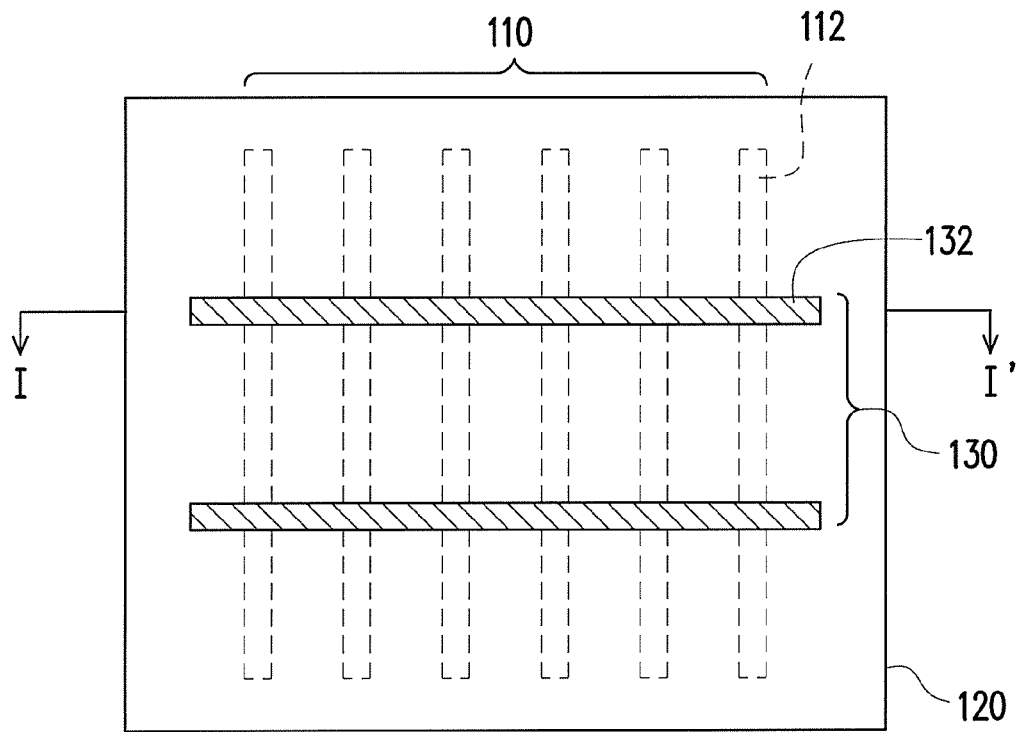
Figure 4B:
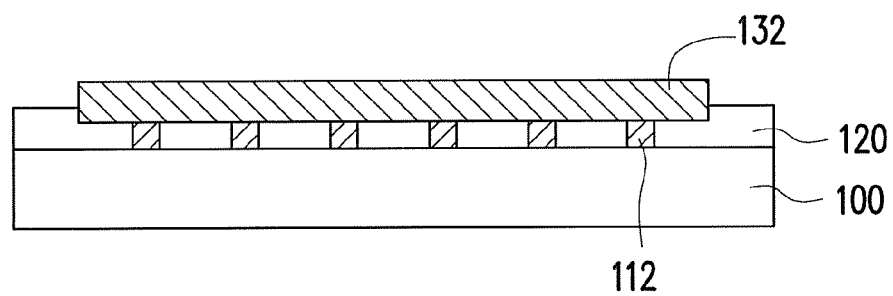

First, referring to FIGS. 4(a) and 4(b), the electrode of the solar cell in the present embodiment at least includes a first electrode layer 110, an antireflective layer 120, and a second electrode layer 130. The first electrode layer 110 is disposed on a photoelectric conversion layer 100. The antireflective layer 120 is disposed on the photoelectric conversion layer 100 to cover the first electrode layer 110. The second electrode layer 130 is disposed on the antireflective layer 120 and electrically connected to the first electrode layer 110. Here, a material of the first electrode layer 110 does not react with the photoelectric conversion layer 100 and the antireflective layer 120 during a sintering process, while at least a material of the second electrode layer 130 reacts with the antireflective layer 120 during the sintering process.

In addition, as shown in FIGS. 4(a) and 4(b), the first electrode layer 110 of the present embodiment includes a plurality of finger-shaped electrodes 112 arranged in parallel, for example. Here, the finger-shaped electrodes 112 are used to collect carriers in the photoelectric conversion layer 100. Besides, a conductive material of the first electrode layer 110 is silver, for example. In order to better prevent metal lines from blocking incident light, the finger-shaped electrodes are preferably formed with relatively small line width. The antireflective layer 120 is made of silicon nitride, for example. The second electrode layer 130 includes a plurality of busbar electrodes 132, for example. Here, a conductive material of the second electrode layer 130 is silver, for example, and a material of the second electrode layer 130 reacting with the antireflective layer 120 during the sintering process is glass frit, for example. In addition, an extending direction of the busbar electrodes 132 crosses over an extending direction of the finger-shaped electrodes 112, and the busbar electrodes 132 and the finger-shaped electrodes 112 are electrically connected at junctions of the busbar electrodes 132 and the finger-shaped electrodes 112. The busbar electrodes 132 of the second electrode layer 130 can be electrically connected to external circuits, such that the carriers collected by the finger-shaped electrodes 112 are complied by the busbar electrodes 132 and then provided to the external circuits.

The following FIGS. 1 to 4 are schematic flowcharts illustrating a fabricating method of the electrode of the solar cell according to the present embodiment.

Figure 1A:
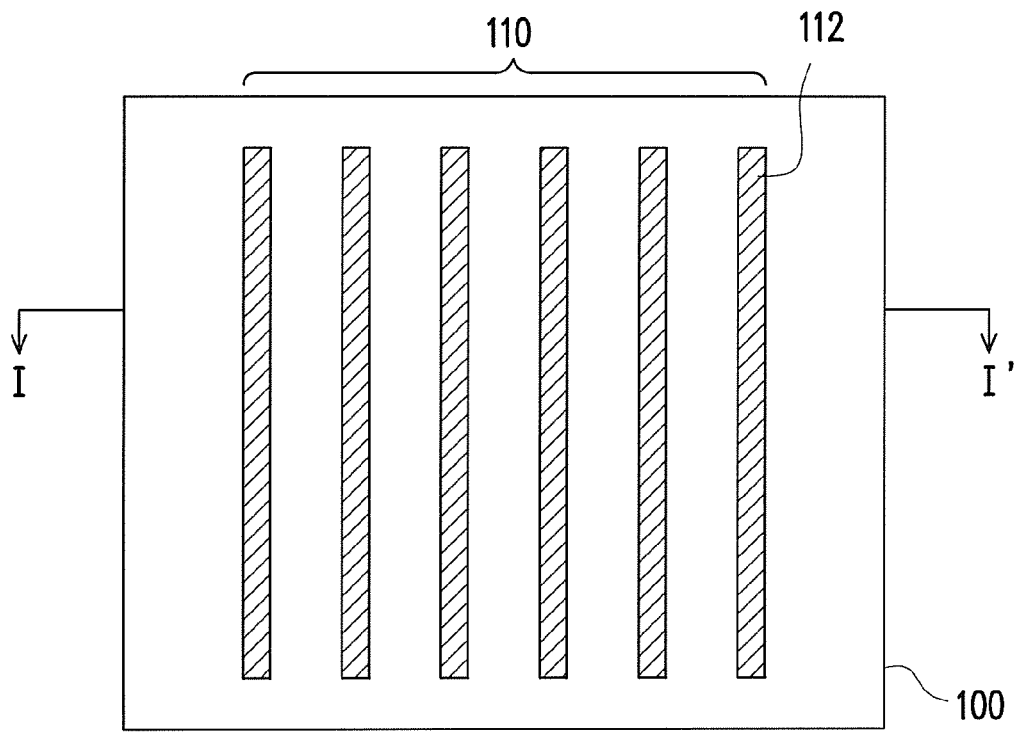
FIGS. 1 to 4 are schematic flowcharts illustrating a fabricating method of an electrode of a solar cell according to a first embodiment of the present invention. More specifically, sub-diagrams (a) of FIGS. 1 to 4 illustrate schematic top views and sub-diagrams (b) of FIGS. 1 to 4 illustrate schematic cross-sectional views taken along a sectional line I-I'.
Figure 1B:
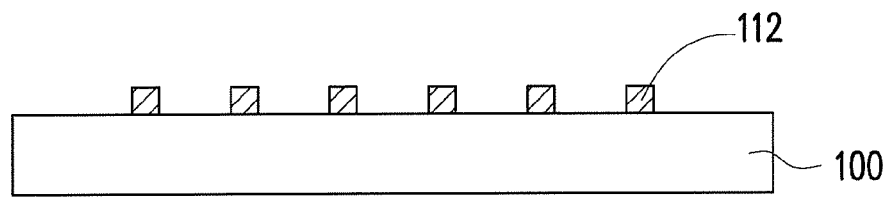

First, referring to FIGS. 1(a) and 1(b), the photoelectric conversion layer 100 is provided. Here, the photoelectric conversion layer 100 is, for example, a silicon substrate having a P-N junction (not shown). A method of forming the silicon substrate having the P-N junction is well known to people having ordinary skill in the art, and therefore no further description in this regard is provided herein.

Next, the first electrode layer 110 is formed on the photoelectric conversion layer 100. Here, the first electrode layer 110 includes a plurality of finger-shaped electrodes 112 arranged in parallel, for example, and a conductive material of the first electrode layer 110 includes silver or any other appropriate material. Note that the first electrode layer 110 does not contain any material reacting with the photoelectric conversion layer 100 and the subsequently formed antireflective layer during the sintering process. A method of forming the first electrode layer 110 is not limited in the present invention as long as the first electrode layer 110 formed thereby does not contain any material reacting with the photoelectric conversion layer 100 and the subsequently formed antireflective layer during the sintering process. For instance, an inkjet printing method or an electroplating method capable of forming electrodes with relatively small line width can be applied for forming the first electrode layer 110 according to the present invention.

Figure 2A:
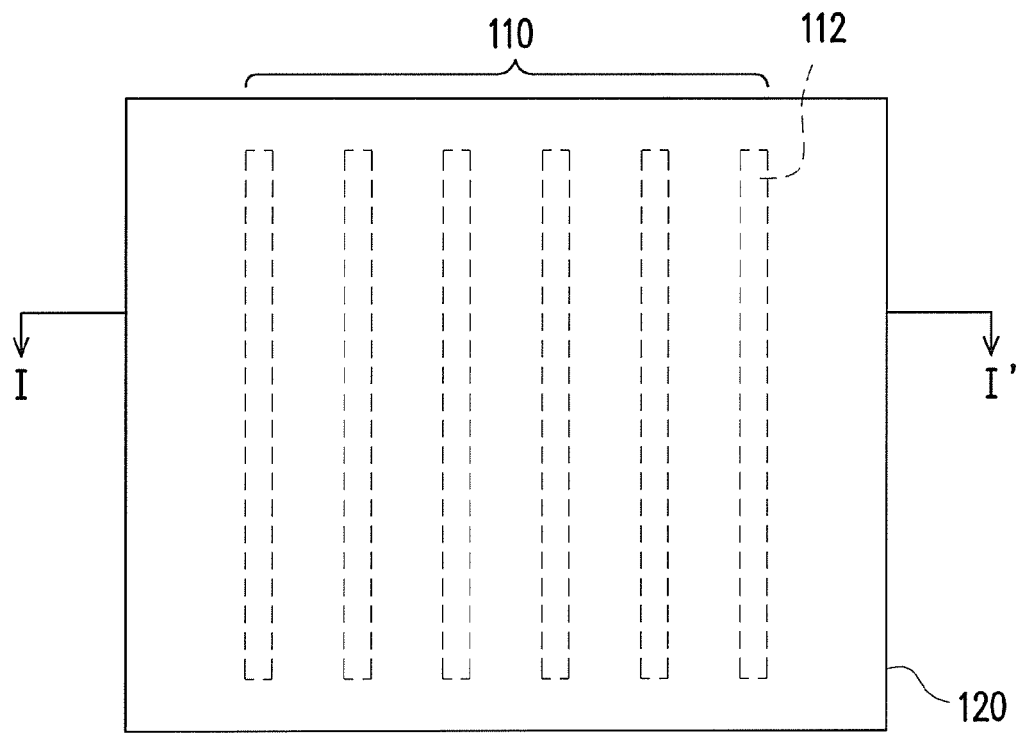
Figure 2B:
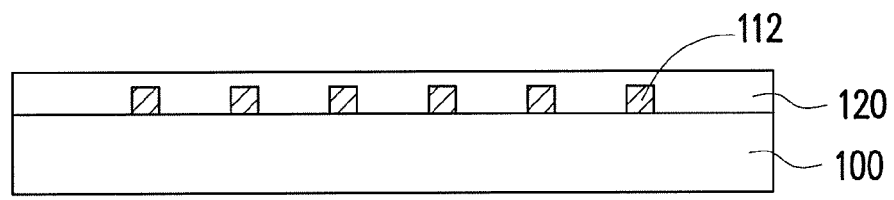

Thereafter, referring to FIGS. 2(a) and 2(b), the antireflective layer 120 is formed on the photoelectric conversion layer 100 to cover the first electrode layer 110. The antireflective layer 120 is made of silicon nitride, for example, and the antireflective layer 120 is formed by performing a plasma enhanced chemical vapor deposition (PECVD) process.

Figure 3A:
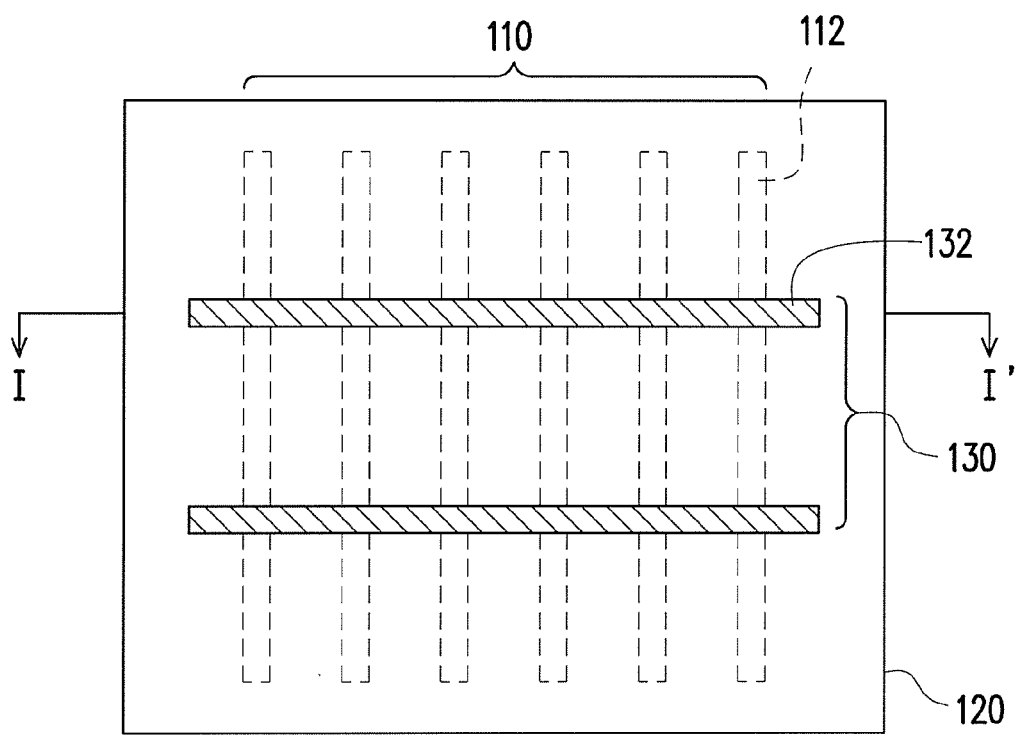
Figure 3B:
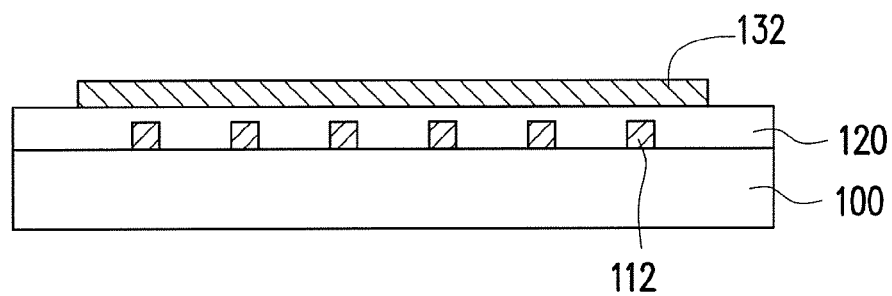

After that, referring to FIGS. 3(a) and 3(b), the second electrode layer 130 is formed on the antireflective layer 120. Here, the second electrode layer 130 includes a plurality of busbar electrodes 132, for example. In addition, an extending direction of the busbar electrodes 132 crosses over an extending direction of the finger-shaped electrodes 112. A conductive material of the second electrode layer 130 includes silver. It should be mentioned that the second electrode layer 130 is further made of at least a material reacting with the antireflective layer 120 during the sintering process, such as glass frit. Therefore, the second electrode layer 130 can be formed by performing a screen printing process, for example. Specifically, the second electrode layer 130 is formed on the antireflective layer 120 by performing the screen printing process with use of paste containing a conductive material and the material reacting with the antireflective layer 120 during the sintering process.

Next, referring to FIGS. 4(a) and 4(b), the sintering process is carried out. Since the second electrode layer 130 has the material reacting with the antireflective layer 120 during the sintering process, the second electrode layer 130 penetrates the antireflective layer 120 and electrically connects the first electrode layer 110 at a junction of the second electrode layer 130 and the first electrode layer 110.

Besides, a back electrode can be formed on the other surface of the photoelectric conversion layer 100 according to the present invention, so as to form the complete solar cell. Since a method of forming the back electrode is well known to people having ordinary skill in the art, it is not specifically described in the present embodiment.

Second Embodiment

FIGS. 5 to 8 are schematic flowcharts illustrating a fabricating method of an electrode of a solar cell according to a second embodiment of the present invention. More specifically, sub-diagrams (a) of FIGS. 5 to 8 illustrate schematic top views and sub-diagrams (b) of FIGS. 5 to 8 illustrate schematic cross-sectional views taken along a sectional line II-II'.

Figure 8A:
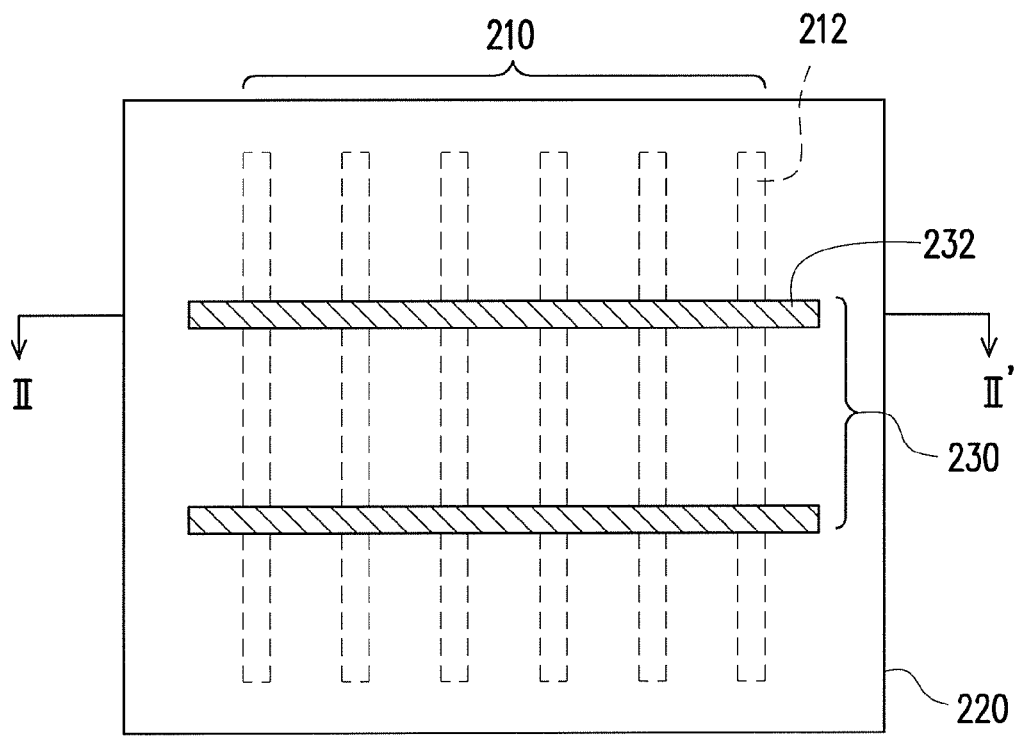
Figure 8B:
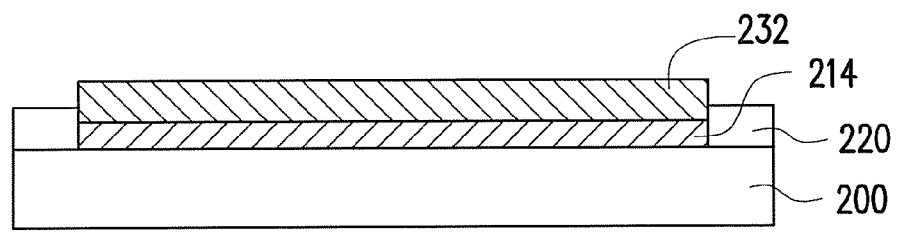

First, referring to FIGS. 8(a) and 8(b), the electrode of the solar cell in the present embodiment at least includes a first electrode layer 210, an antireflective layer 220, and a second electrode layer 230. The first electrode layer 210 is disposed on a photoelectric conversion layer 200. The antireflective layer 220 is disposed on the photoelectric conversion layer 200 to cover the first electrode layer 210. The second electrode layer 230 is disposed on the antireflective layer 220 and electrically connected to the first electrode layer 210. Here, a material of the first electrode layer 210 does not react with the photoelectric conversion layer 200 and the antireflective layer 220 during a sintering process, while at least a material of the second electrode layer 230 reacts with the antireflective layer 220 during the sintering process.

In addition, as shown in FIGS. 8(a) and 8(b), the first electrode layer 210 of the present embodiment includes a plurality of finger-shaped electrodes 212 arranged in parallel and a plurality of busbar electrodes 214 crossing over the finger-shaped electrodes 212, for example. Here, the finger-shaped electrodes 212 are used to collect carriers in the photoelectric conversion layer 200. A conductive material of the first electrode layer 210 is silver, for example. In order to better prevent the finger-shaped electrodes 212 from blocking incident light, the finger-shaped electrodes 212 are preferably formed with relatively small line width. Besides, the antireflective layer 220 is made of silicon nitride, for example. The second electrode layer 230 includes a plurality of busbar electrodes 232, for example. Here, a conductive material of the second electrode layer 230 is silver, for example, and a material of the second electrode layer 230 reacting with the antireflective layer 220 during the sintering process is glass frit, for example. Moreover, an extending direction of the busbar electrodes 232 equates and overlaps with an extending direction of the busbar electrodes 214, and the busbar electrodes 232 and the busbar electrodes 214 are electrically connected. The busbar electrodes 232 of the second electrode layer 230 can be electrically connected to external circuits, such that the carriers collected by the finger-shaped electrodes 212 are complied by the busbar electrodes 214 and 232 and then provided to the external circuits.

The following FIGS. 5 to 8 are schematic flowcharts illustrating a fabricating method of the electrode of the solar cell according to the present embodiment.

Figure 5A:
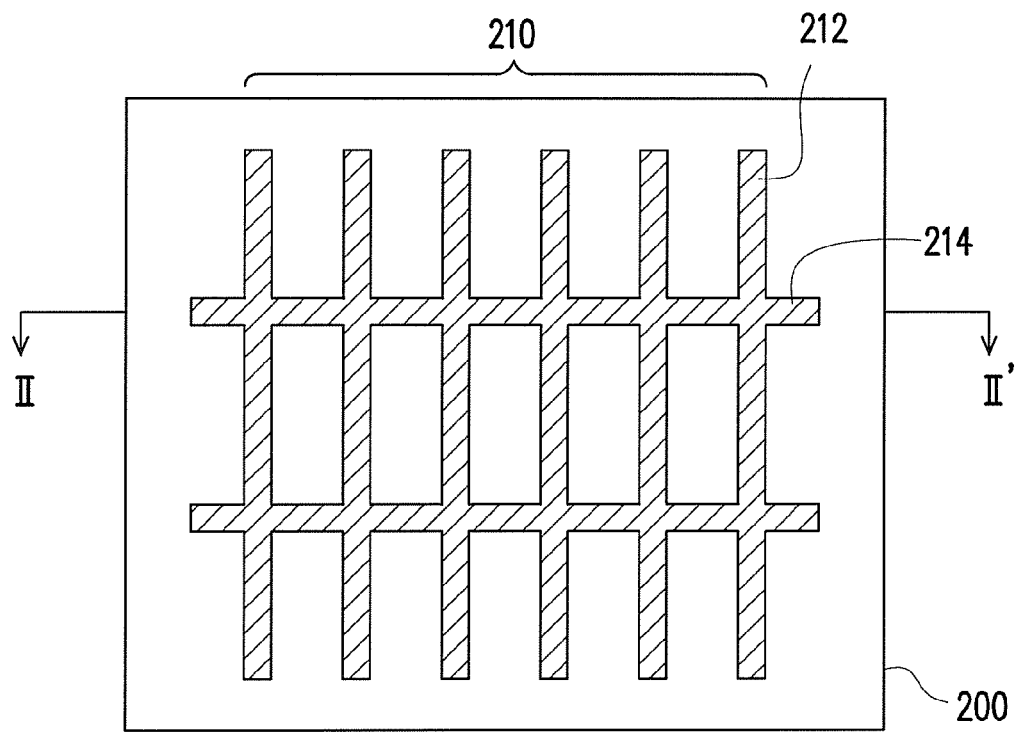
FIGS. 5 to 8 are schematic flowcharts illustrating a fabricating method of an electrode of a solar cell according to a second embodiment of the present invention. More specifically, sub-diagrams (a) of FIGS. 5 to 8 illustrate schematic top views and sub-diagrams (b) of FIGS. 5 to 8 illustrate schematic cross-sectional views taken along a sectional line II-II'.
Figure 5B:
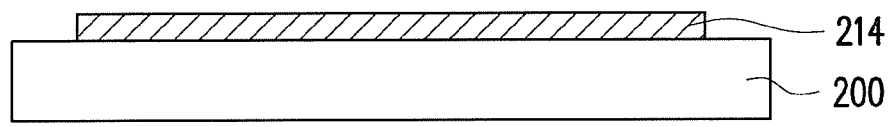

First, referring to FIGS. 5(a) and 5(b), the photoelectric conversion layer 200 is provided. Here, the photoelectric conversion layer 200 is, for example, a silicon substrate having a P-N junction (not shown). A method of forming the silicon substrate having the P-N junction is well known to people having ordinary skill in the art, and therefore no further description in this regard is provided herein.

Next, the first electrode layer 210 is formed on the photoelectric conversion layer 200. Here, the first electrode layer 210 includes a plurality of finger-shaped electrodes 212 arranged in parallel and a plurality of busbar electrodes 214 crossing over the finger-shaped electrodes 212, for example, and a conductive material of the first electrode layer 210 includes silver or any other appropriate material. Note that the first electrode layer 210 does not contain any material reacting with the photoelectric conversion layer 200 and the subsequently formed antireflective layer during the sintering process. A method of forming the first electrode layer 210 is not limited in the present invention as long as the first electrode layer 210 formed thereby does not contain any material reacting with the photoelectric conversion layer 200 and the subsequently formed antireflective layer during the sintering process. For instance, an inkjet printing method or an electroplating method capable of forming electrodes with relatively small line width can be applied for forming the first electrode layer 210 according to the present invention.

Figure 6A:
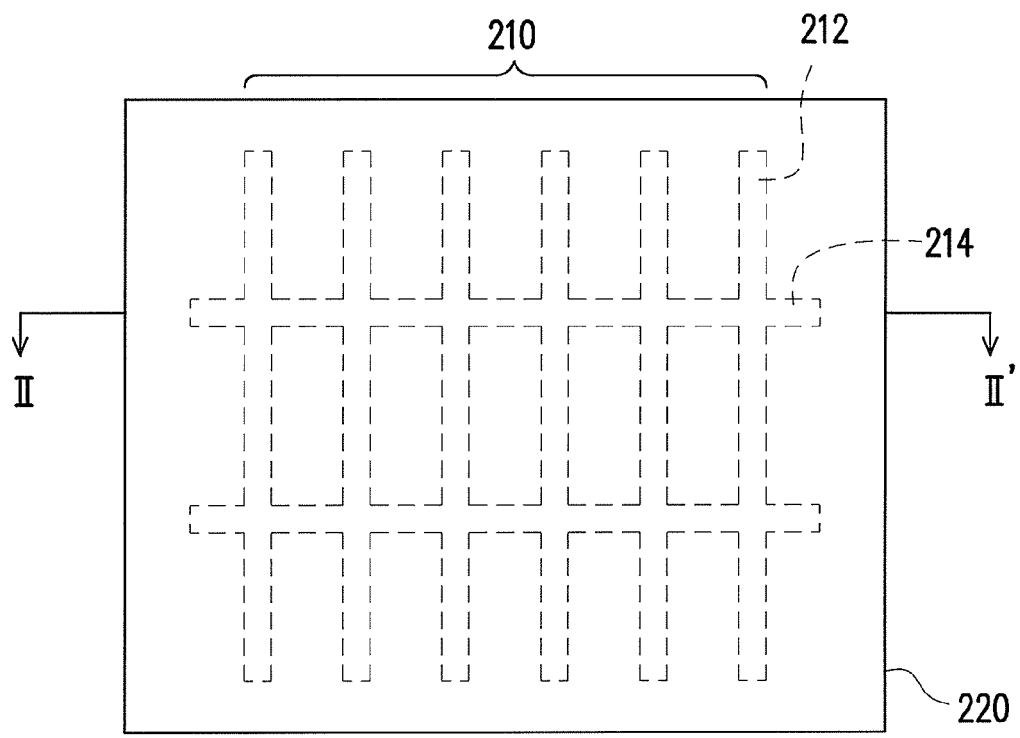
Figure 6B:
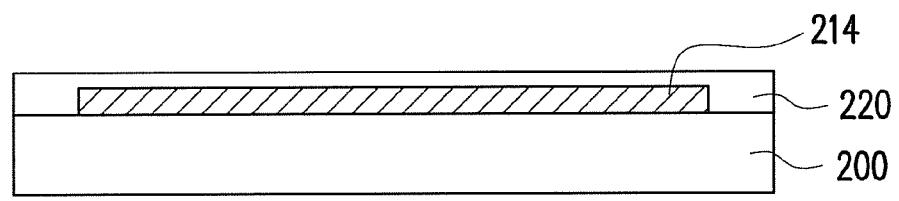

Thereafter, referring to FIGS. 6(a) and 6(b), the antireflective layer 220 is formed on the photoelectric conversion layer 200 to cover the first electrode layer 210. The antireflective layer 220 is made of silicon nitride, for example, and the antireflective layer 220 is formed by performing a PECVD process.

Figure 7A:
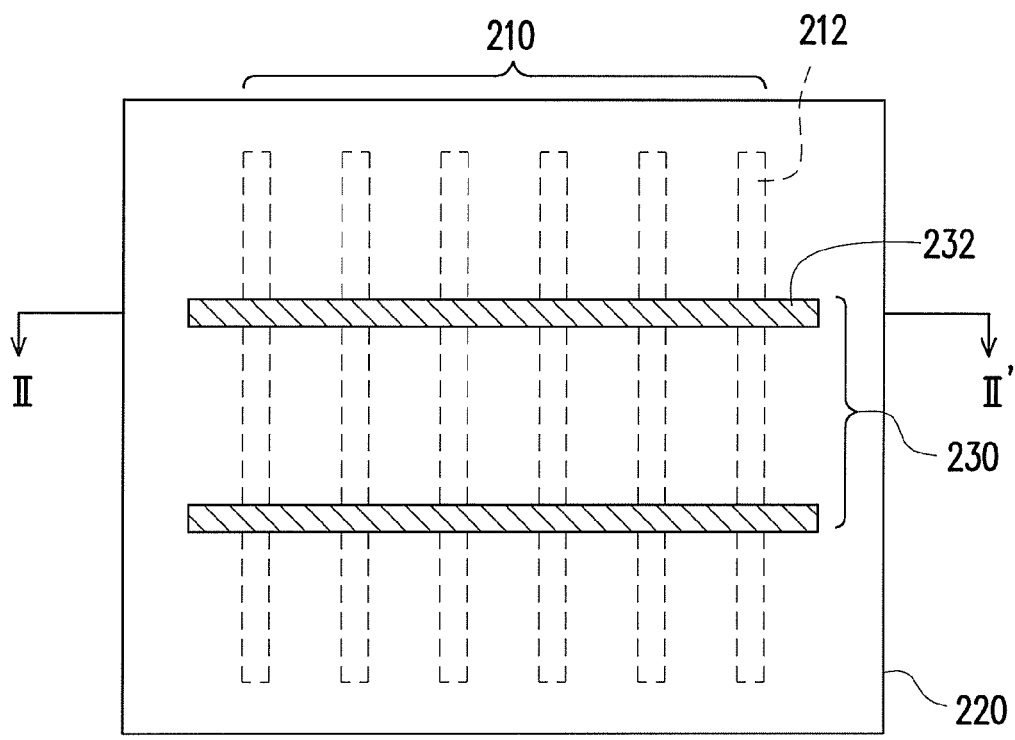
Figure 7B:
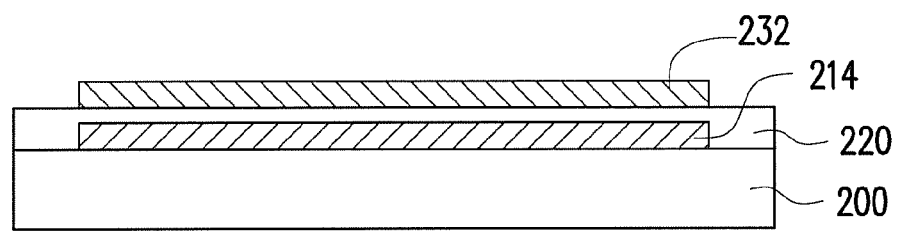

After that, referring to FIGS. 7(a) and 7(b), the second electrode layer 230 is formed on the antireflective layer 220. Here, the second electrode layer 230 includes a plurality of busbar electrodes 232, for example. In addition, an extending direction of the busbar electrodes 232 equates and overlaps with an extending direction of the busbar electrodes 214. A conductive material of the second electrode layer 230 includes silver. It should be mentioned that the second electrode layer 230 is further made of at least a material reacting with the antireflective layer 220 during the sintering process, such as glass frit. Therefore, the second electrode layer 230 can be formed by performing a screen printing process, for example. Specifically, the second electrode layer 230 is formed on the antireflective layer 220 by performing the screen printing process with use of paste containing a conductive material and the material reacting with the antireflective layer 220 during the sintering process.

Next, referring to FIGS. 8(*a*) and 8(*b*), the sintering process is carried out. Since the second electrode layer 230 has the material reacting with the antireflective layer 220 during the sintering process, the second electrode layer 230 penetrates the antireflective layer 220, and the busbar electrodes 232 of the second electrode layer 230 electrically connect the busbar electrodes 214 of the first electrode layer 210.

Besides, a back electrode can be formed on the other surface of the photoelectric conversion layer 200 according to the present invention, so as to form the complete solar cell. Since a method of forming the back electrode is well known to people having ordinary skill in the art, it is not specifically described in the present embodiment.

In summary, the present invention at least has the following advantages:

In the first electrode layer and in the method of forming the same according to the present invention, there is no material reacting with the photoelectric conversion layer and the antireflective layer during the sintering process. Thereby, the first electrode layer can be prevented from penetrating the P-N junction of the photoelectric conversion layer, such that the efficiency of the solar cell formed by the fabricating method of the present invention is neither reduced nor deteriorated.

The first electrode layer can be formed by applying the method capable of forming the electrode having a small line width, such as the inkjet printing method. Hence, it is likely to form the finger-shaped electrodes with the small line width and to increase the irradiated area of the solar cell formed by applying the fabricating method of the present invention.

In the second electrode layer and in the method of forming the same according to the present invention, there is a material reacting with the antireflective layer during the sintering process, and therefore the second electrode layer can penetrate the antireflective layer and electrically connect the first electrode layer through performing the sintering process in no need of forming openings on the antireflective layer. Thus, it is prone to obtain electricity from the second electrode layer or to implement a welding process for manufacturing modules, giving rise to simplified fabrication and low manufacturing costs.

According to the second embodiment of the present invention, the busbar electrodes are formed in the first electrode layer, and the busbar electrodes in the second electrode layer are overlapped with the busbar electrodes in the first electrode layer. After implementation of the sintering process, the busbar electrodes in the second electrode layer do not go beyond the busbar electrodes in the first electrode layer. As such, the second electrode layer is not allowed to penetrate the P-N junction of the photoelectric conversion layer, thereby effectively preventing the efficiency of the electrode of the solar cell from being reduced or deteriorated.

Although the present invention has been disclosed above by the embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A fabricating method of an electrode of a solar cell, comprising:
    forming a first electrode layer directly on a photoelectric conversion layer, wherein the first electrode layer is a non-transparent electrode layer comprising a plurality of finger-shaped electrodes arranged in parallel, and the first electrode layer comprises silver;
    forming an antireflective layer on the photoelectric conversion layer to cover the first electrode layer, wherein the antireflective layer comprises silicon nitride;
    forming a second electrode layer on the antireflective layer, wherein the second electrode layer comprises silver and glass frit, the first electrode layer does not react with the photoelectric conversion layer and the antireflective layer during a sintering process, and the glass frit reacts with the antireflective layer during the sintering process; and
    performing the sintering process, such that the second electrode layer reacts with the antireflective layer and penetrates the antireflective layer to electrically connect the first electrode layer.

2. The fabricating method of the electrode of the solar cell as claimed in claim 1, wherein the second electrode layer comprises a plurality of busbar electrodes, an extending direction of the plurality of busbar electrodes crosses over an extending direction of the plurality of finger-shaped electrodes, and the plurality of busbar electrodes and the plurality of finger-shaped electrodes are electrically connected at junctions of the plurality of busbar electrodes and the plurality of finger-shaped electrodes.

3. The fabricating method of the electrode of the solar cell as claimed in claim 1, wherein a method of forming the first electrode layer comprises performing an inkjet printing process or an electroplating process.

4. The fabricating method of the electrode of the solar cell as claimed in claim 1, wherein a method of forming the second electrode layer comprises performing a screen printing process.

5. The fabricating method of the electrode of the solar cell as claimed in claim 1, wherein the first electrode layer further comprising a plurality of first busbar electrodes crossing over the plurality of finger-shaped electrodes.

6. The fabricating method of the electrode of the solar cell as claimed in claim 5, wherein the second electrode layer comprises a plurality of second busbar electrodes, an extending direction of the plurality of second busbar electrodes equates and overlaps with an extending direction of the plurality of first busbar electrodes, and the plurality of second busbar electrodes and the plurality of first busbar electrodes are electrically connected.

* * * * *